United States Patent [19]

Yamanaka

[11] Patent Number: 5,532,590
[45] Date of Patent: Jul. 2, 1996

[54] APPARATUS FOR MEASURING CIRCUIT PARAMETERS WHEREIN ERRORS DUE TO TRANSMISSION LINES ARE PREVENTED

[75] Inventor: Haruhiko Yamanaka, Hyogo, Japan

[73] Assignee: Hewlett-Packard Company, Palo Alto, Calif.

[21] Appl. No.: 261,154

[22] Filed: Jun. 17, 1994

[30] Foreign Application Priority Data

Jun. 30, 1993 [JP] Japan ................................. 5-187109

[51] Int. Cl.$^6$ .......................... G01R 27/00; G01R 33/12; G01R 33/14
[52] U.S. Cl. .................. 324/239; 324/223; 324/225; 324/241; 324/649; 324/713; 324/720
[58] Field of Search ........................ 324/211, 222, 324/223, 225, 239–243, 522–524, 600, 605, 615, 649, 654, 713–717, 720, 726

[56] References Cited

U.S. PATENT DOCUMENTS

| | | | |
|---|---|---|---|
| 4,928,062 | 5/1990 | Miles et al. | 324/636 X |
| 5,345,182 | 9/1994 | Wakamatsu | 324/649 |

OTHER PUBLICATIONS

"The Impedance Measurement Handbook", Hewlett Packard, Feb., 1989, HP PIN 5950-3000, pp. 2-1 to 2-3, 3-1 to 3-4, 4-8 to 4-9.

"High–Frequency Measurement Techniques For Magnetic Cores", IEEE Power Electronics Specialists Conference, V. Joseph Thottuvelil, et al., 1985, pp. 412 to 425.

"100kHz–10MHz Iron Loss Measurement System", IEEE Transactions on Magnetics, T. Sato, et al., Sep., 1985, vol. MAG-23, No. 5, pp. 2593 to 2595.

"Some Problems On Very High Frequency Iron Loss Measuring System" T. Sato, et al., 1986, PE86-27, pp. 17 to 24. (in Japanese, with English translation).

Primary Examiner—Gerard R. Strecker

[57] ABSTRACT

A measuring circuit obtains desired characteristic values of a device under test by accurately measuring a voltage and a current. Errors are eliminated that originate from the transmission characteristics of cables used in measurements at high frequencies and measurements using long cables. The errors are eliminated by connecting resistors that are equal in resistance to the characteristic impedance of cables, to the inputs of the cables which connect the device under test to a measuring device.

4 Claims, 7 Drawing Sheets

APPARATUS FOR MEASURING CIRCUIT PARAMETERS WHEREIN ERRORS DUE TO TRANSMISSION LINES ARE PREVENTED

FIELD OF THE INVENTION

The present invention relates to an apparatus for measuring circuit constants such as impedance and the characteristics of materials, especially the magnetic characteristics and the like of magnetic materials.

DESCRIPTION OF THE PRIOR ART

FIG. 4 shows the principles of the measurement performed by a typical conventional magnetic characteristics measuring apparatus. A primary coil 6 and a secondary coil 7 are wound around a magnetic material 5 which is installed in a fixture 4. The fixture 4 and a main body 16 of the measuring apparatus are connected by coaxial cables 13 and 15. An excitation current is applied from a signal generator 1 through a current amplifier 2 and a coaxial cable 3 to the primary coil 6, and a voltage drop at a detection resistor 8 is measured by a voltmeter 20 to obtain the excitation current. An induced voltage generated at the secondary coil 7 is measured by a voltmeter 19. Various magnetic characteristics are obtained through calculation from the measured values of the excitation current and the induced voltage. Therefore, in order to measure the characteristics of a magnetic material with high accuracy, it is necessary to accurately measure the excitation current and the induced voltage.

Next, FIG. 7 shows the principles of measurement performed by a typical conventional impedance measuring apparatus. 57 designates a main body of the impedance measuring apparatus, and a device under test (DUT) 52 is placed in a fixture 51 which is apart from the main body of the measuring apparatus. The fixture 51 and the main body 57 of the measuring apparatus are connected by coaxial cables 53, 54, 55 and 56. This figure focuses on the principles of measurement including the connection between the main body 57 of the measuring apparatus and the device under test and therefore does not show parts having no direct relationship with the present invention. A measurement signal supplied from a signal source 58 in the main body 57 of the measuring apparatus to the device under test 52 is measured by a vector ammeter 60. The voltage across the device under test 52 is measured by a vector voltmeter 59. Desired circuit constants such as impedance are obtained through calculation and the like from the measured values of the vector voltage and the vector current. Therefore, in order to measure the circuit constants with high accuracy, it is necessary to accurately measure the voltage and current at the device under test just as in the measurement of magnetic characteristics.

In either of the above-described measurement instances, the voltage or current at a device under test is measured by a measuring apparatus through cables. The problem in the prior art is that the voltage or current at the device under test is not transmitted to the input end of the measuring apparatus without errors due to the transmission characteristics of the cables.

Errors originating from the transmission characteristics of a cable will be analyzed using FIG. 8. In FIG. 8, 71 designates the cable. Vx and Ix designate the voltage and current at the input side of the cable. 72 designates input impedance Zin of a voltmeter or an ammeter to which a voltage Vm and a current Im are transmitted. In other words, Vx and Ix are true values and Vm and Im are measured values.

If it is supposed that the cable is a loss-free line and $\lambda$ represents the wavelength of a measurement signal, the propagation constant of the cable is represented by only a phase constant $\beta$ which satisfies $\beta=2\pi/\lambda$. If the characteristic impedance of the cable and the length of the cable are represented by Zo and L, respectively, the relationship between Vx, Ix, Vm and Im is expressed as follows from transmission parameters where Vx, Ix, Vm and Im represent vector values.

$$\begin{bmatrix} Vx \\ Ix \end{bmatrix} = \begin{bmatrix} \cos\beta L & jZo\sin\beta L \\ j\frac{1}{Zo}\sin\beta L & \cos\beta L \end{bmatrix} \begin{bmatrix} Vm \\ Im \end{bmatrix} \quad (1)$$

From $\beta=2\pi/\lambda$ and Vm=ImZin, the relationships between Vx and Vm and between Ix and Im are as follows.

$$\frac{Vm}{Vx} = \frac{1}{\cos(2\pi L/\lambda) + j(Zo/Zin)\sin(2\pi L/\lambda)} \quad (2)$$

$$\frac{Im}{Ix} = \frac{1}{\cos(2\pi L/\lambda) + j(Zin/Zo)\sin(2\pi L/\lambda)} \quad (3)$$

Since equations (2) and (3) represent the relationship between measured values and true values, it is easy to obtain errors from them. It is apparent from equations (2) and (3) that errors are significant if the input impedance Zin of the voltmeter or ammeter is not equal to the characteristic impedance Zo and the length of the cable L is not negligible with respect to the wavelength $\lambda$.

If the input impedance Zin of the voltmeter or ammeter is equal to the characteristic impedance Zo or the length of the cable L is negligibly small with respect to the wavelength $\lambda$, there is no transmission error. If Zin is made equal to Zo, however, errors are generated from sources other than the transmission characteristics of the cable. For example, in the measurement of magnetic characteristics shown in FIG. 4, if the input impedance of the voltmeter 19 is not high, a current flows through the secondary coil 7. As a result, the magnetic field calculated from the excitation current through the primary coil 6 will not agree with the actual magnetic field in the magnetic material. Making Zin equal to Zo thus creates other problems and therefore is not a practical solution.

On the other hand, if the input impedance Zin is infinite, there is a problem in that the measurement itself is disabled because Vm/Vx=∞ where L=$\lambda$/4.

Further, the ratio of the absolute value of (2) and (3) vary depending on the frequency and the phase angle is not proportionate to the frequency. Therefore, in the case of a distorted wave, the waveform transmitted is deformed. In other words, the waveforms of the true values and the measured values are different from each other. Especially, in the measurement of magnetic characteristics wherein a distorted wave can be easily generated, if there are differences between the waveforms of true exciting current and induced voltage, there is a problem in that magnetization curves drawn based on these waveforms will be also different from how they should be.

As described above, according to the conventional measuring methods, it has been difficult to perform measurement at high frequencies or measurement using long cables with high accuracy because of errors originating from the transmission characteristics of the cables. Especially, the problem is that measurement is disabled where L=$\lambda$/4.

OBJECT OF THE INVENTION

It is an object of the present invention to provide a method for obtaining desired characteristic values by accurately measuring a voltage and a current, with errors originating from the transmission characteristics of cables eliminated in measurement at high frequencies and measurement using long cables.

SUMMARY OF THE INVENTION

In embodiments of the present invention, a resistor having resistance equal to the impedance characteristic of a cable for measuring a voltage or a current is connected to the input side of the cable to eliminate errors originating from the transmission characteristics of the cable.

DETAILED DESCRIPTION OF THE INVENTION

Figure 1:
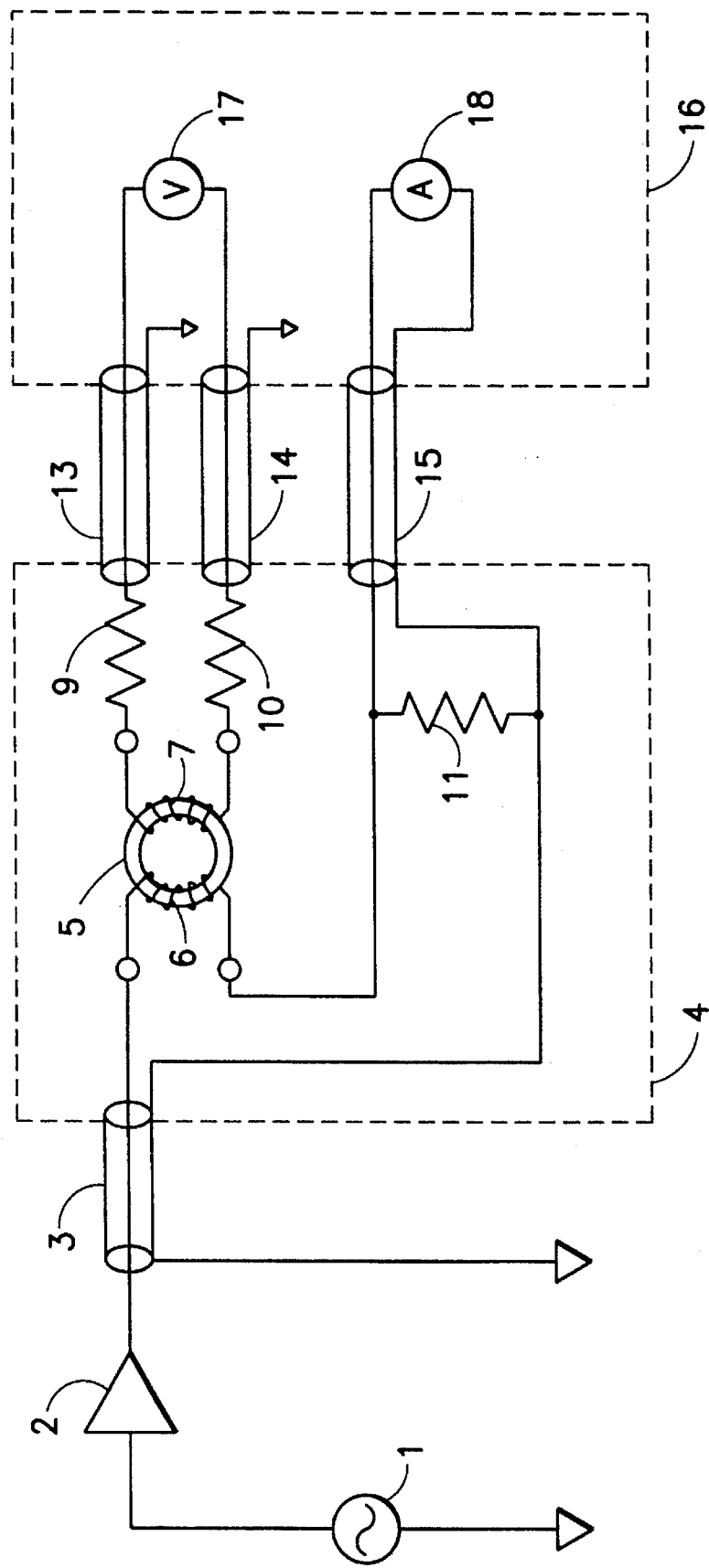
FIG. 1 is an embodiment of a magnetic characteristics measuring apparatus according to the present invention.
Figure 4:
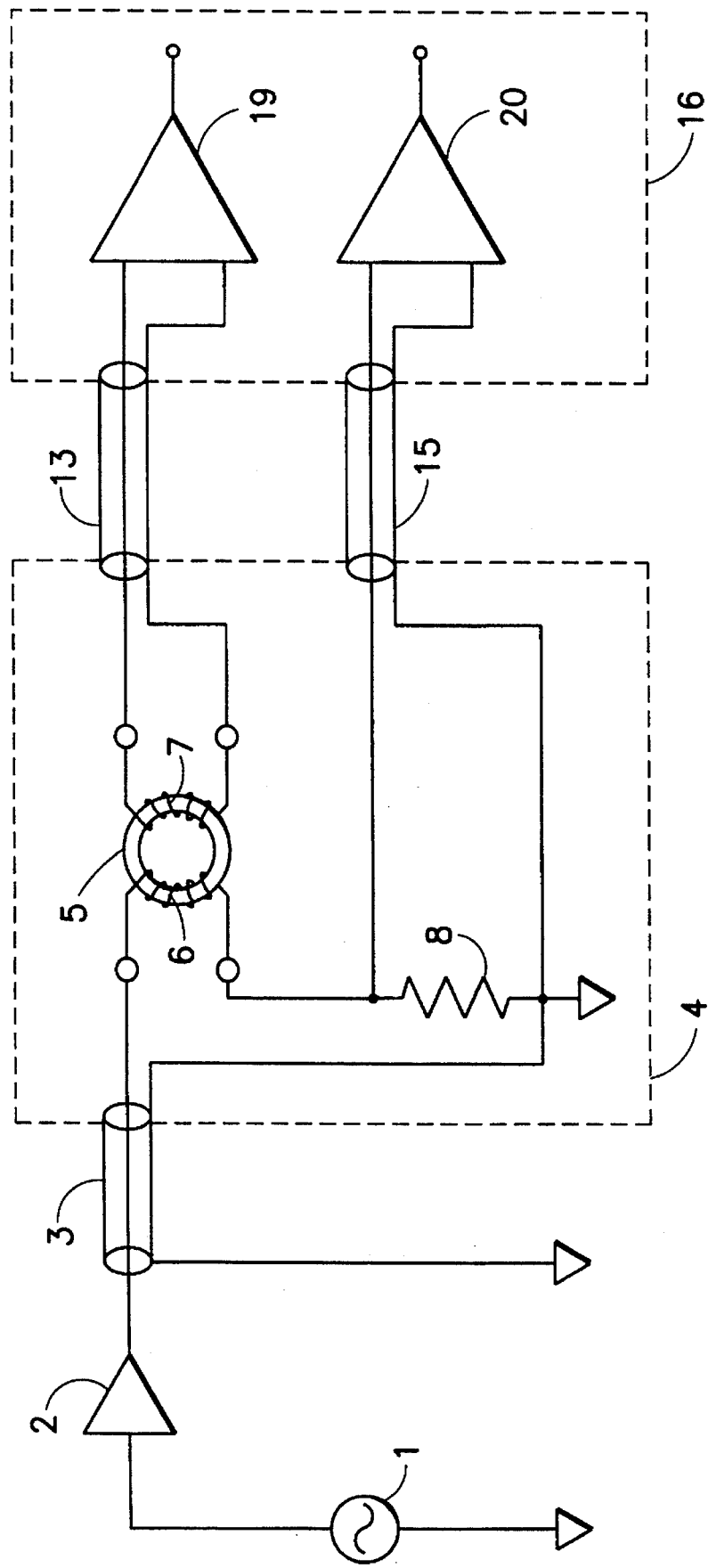
FIG. 4 shows the principles of the measurement performed by a typical conventional magnetic characteristics measuring apparatus.

FIG. 1 shows an embodiment of a magnetic characteristics measuring apparatus according to the present invention. Elements having functions similar to those in FIG. 4 are given like reference numbers. Connection is made so that the exciting current which has exited the primary coil 6 will enter the ammeter 18 in the main body 16 of the measuring device through the core wire (inner conductor) of the cable 15 and then returns to ground through the outer conductor of the cable 15. A resistor 11 having resistance equal to the characteristic impedance of the cable 15 is connected between the core wire and outer conductor of the cable 15 at the side of the primary coil.

The induced voltage at the secondary coil 7 is connected to the voltmeter 17 through the cables 13 and 14. Resistors 9 and 10 are equal in resistance to the characteristic impedance of cables 13 and 14 and, respectively, are connected in series between the secondary coil 7 and cables 13 and 14.

Figure 8:
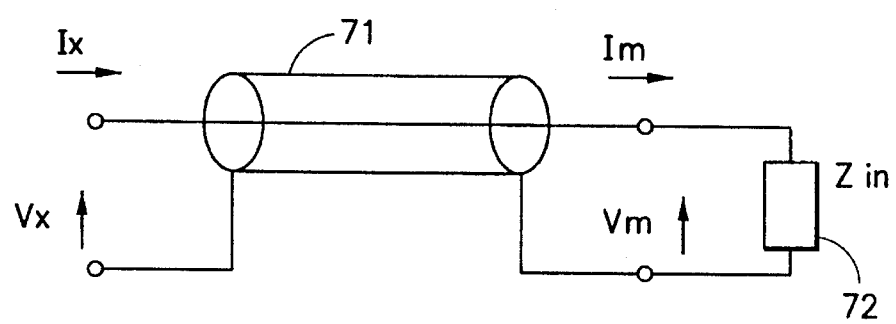
FIG. 8 is a model for analyzing errors originating from the transmission characteristics of a cable.

It will now be described that errors originating from the transmission characteristics of the cables can be eliminated in accordance with this method. In measurement of a voltage by a voltmeter 17, a resistor is connected in series to the input side of the cable. In FIG. 8, this is to cascade-connect a resistor R as a series element to the input side of a cable 71. Therefore, the relationship between the true value Vx and measured value Vm of the voltage is expressed as follows from transmission parameters.

$$\begin{bmatrix} Vx \\ Ix \end{bmatrix} = \begin{bmatrix} 1 & R \\ 0 & 1 \end{bmatrix} \begin{bmatrix} \cos\beta L & jZ_o\sin\beta L \\ j\frac{1}{Z_o}\sin\beta L & \cos\beta L \end{bmatrix} \begin{bmatrix} Vm \\ Im \end{bmatrix} \quad (4)$$

If $R = Z_o$, $$\frac{Vm}{Vx} = \frac{Z_{in}}{Z_{in}+Z_o} \exp(-j2\pi L/\lambda) \quad (5)$$

Therefore, the ratio of the amplitude of Vx to that of Vm is as follows.

$$\left|\frac{Vm}{Vx}\right| = \left|\frac{Z_{in}}{Z_{in}+Z_o}\right| \quad (6)$$

Thus, the ratio has no relationship with the transmission characteristics of the cable. It also has no relationship with the length of the cable and there is no problem where $L=\lambda/4$. The true value |Vx| is obtained from the measured value |Vm| using equation (6) if the input impedance Zin is known. The phase difference between Vm and Vx is obtained as $-2\pi/\lambda$ from equation (5). Since it increases in proportion to frequency, the waveforms of Vx and Vm agree with each other even if Vx is a distorted wave.

In the case of current measurement Im by ammeter 17, a resistor is connected between the core wire and the outer conductor of the cable at the input side thereof. In FIG. 8, this is to cascade-connect a resistor 1/G as a parallel element to the input side of the cable 71. Therefore, the relationship between the true value Ix and measured value Im of the current is expressed as follows from transmission parameters.

$$\begin{bmatrix} Vx \\ Ix \end{bmatrix} = \begin{bmatrix} 1 & 0 \\ G & 1 \end{bmatrix} \begin{bmatrix} \cos\beta L & jZ_o\sin\beta L \\ j\frac{1}{Z_o}\sin\beta L & \cos\beta L \end{bmatrix} \begin{bmatrix} Vm \\ Im \end{bmatrix} \quad (7)$$

If $1/G = Z_o$ $$\frac{Im}{Ix} = \frac{Z_o}{Z_{in}+Z_o} \exp(-j2\pi L/\lambda) \quad (8)$$

Therefore, the ratio of the amplitude of Im to that of Ix is as follows.

$$\left|\frac{Im}{Ix}\right| = \left|\frac{Z_o}{Z_{in}+Z_o}\right| \quad (9)$$

Thus, the result is similar to that in the case of voltage. Specifically, the true value |Im| is obtained from the measured value |Im| if the input impedance of the ammeter is known. The waveforms of Ix and Im agree with each other as in the case of voltage.

As described above, the measuring method according to the present invention does not produce errors in amplitude originating from the cables connecting a device under test and the voltmeter and the ammeter. The waveforms of a voltage and a current can be properly transmitted even if they are distorted waves.

Further, in measuring impedance or the like, the accuracy of a phase difference is important in addition to the amplitude of voltage and current. According to the method of the present invention, the phase lag originating from the cables is $-2\pi L/\lambda$ for both current and voltage as apparent from equations (5) and (6). Therefore, if the cables for measuring current and voltage are equal in length, the phase differences in the measured values of the current and voltage are not affected by the cables.

Figure 2:
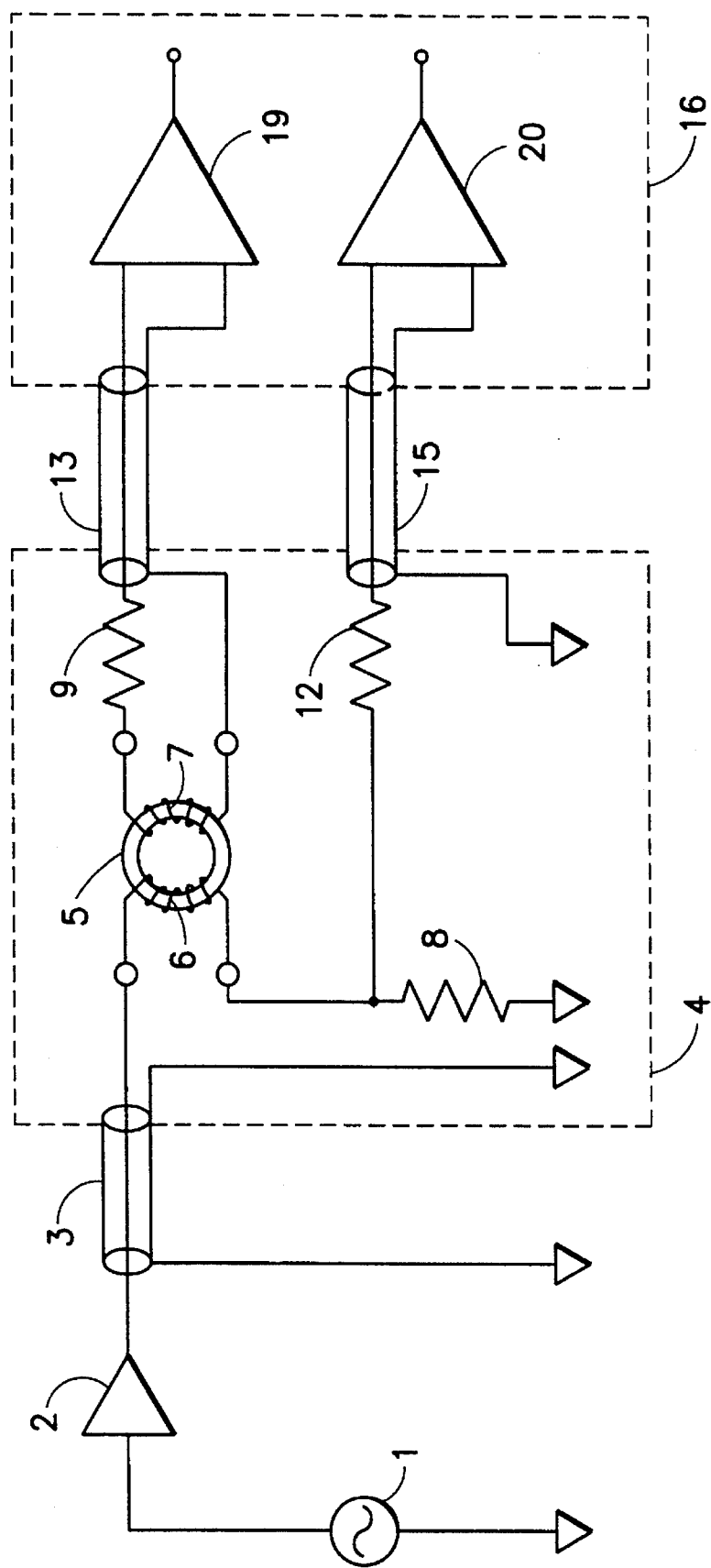
FIG. 2 is a second embodiment of a magnetic characteristics measuring apparatus according to the present invention.

Another embodiment of the present invention will now be described, wherein the principle of eliminating errors originating from the transmission characteristics of cables is completely the same as above. FIG. 2 is a second embodiment of a magnetic characteristics measuring apparatus. Elements having functions similar to those in FIG. 4 are given like reference numbers. Since it is a method of measuring the value of a voltage by converting an exciting current into a voltage drop at the detection resistor 8 just as in FIG. 4, a resistor 12 having resistance equal to the characteristic impedance of the cable 15 is connected in series to the core wire of the cable 15 at the input side thereof to eliminate errors originating from the transmission characteristics of the cable 15.

An induced voltage at the secondary coil 7 is connected to the voltmeter 19 through the cable 13. The resistor 9 having resistance equal to the characteristic impedance of the cable 13 is connected in series between the secondary coil 7 and the cable 13 to eliminate errors originating from the transmission characteristics of the cable 13.

Figure 3:
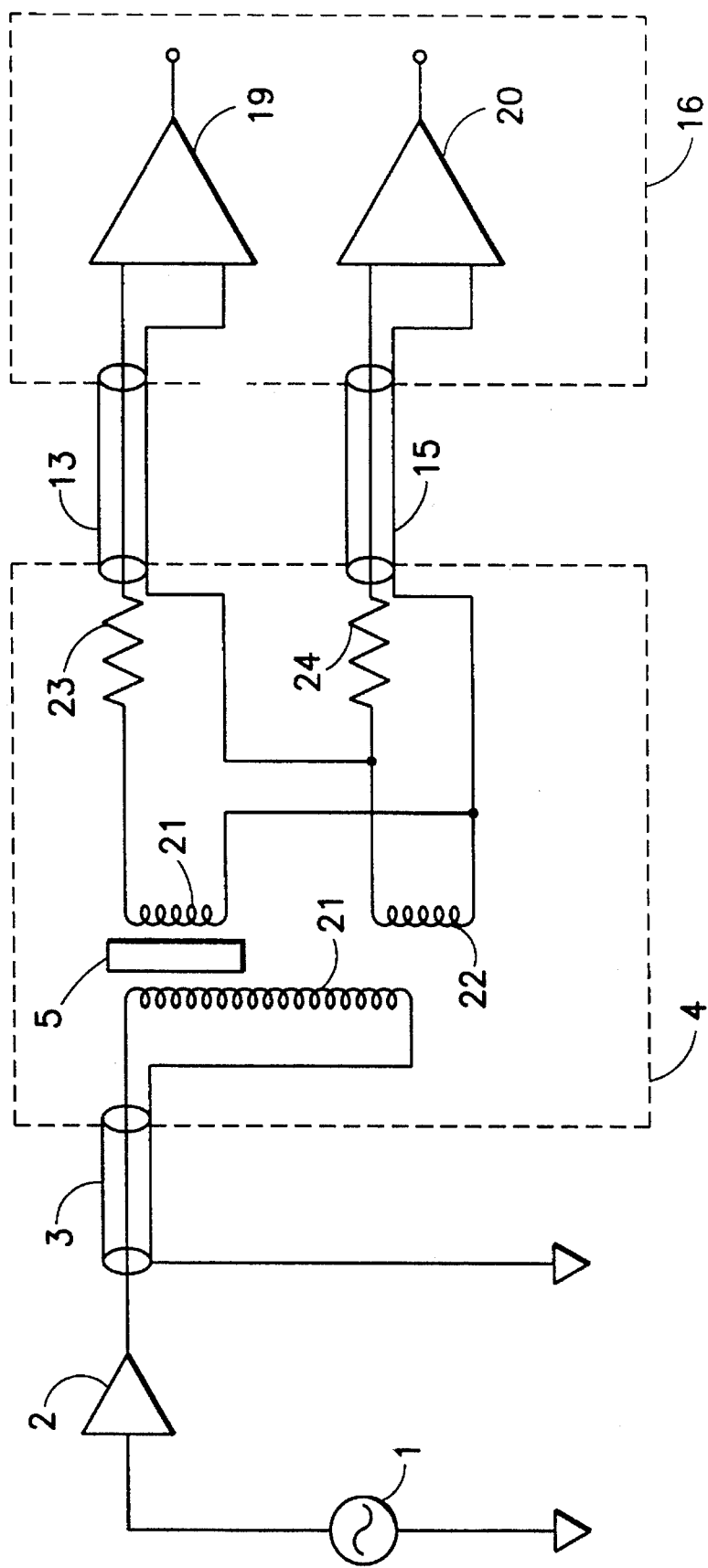
FIG. 3 is a third embodiment of a magnetic characteristics measuring apparatus according to the present invention.

FIG. 3 shows a third embodiment of a magnetic characteristics measuring apparatus. This is an example of implementation of the present invention to a measuring method referred to as compensated coil method or figure eight coil method. The magnetic material 5 is inserted in a coil 21 and a coil 22 is an air-core type. In order to compensate for a gap inside the coil 21, the coil 21 and 22 are connected so that an induced voltage at the air-cored coil 22 is subtracted from an induced voltage at the coil 21. The induced voltage which has been thus subjected to the compensation for the gap is measured by the voltmeter 19. Since the coil 22 is not only for the gap compensation but it also works as a magnetic field detecting coil, the induced voltage at the coil 22 is measured by also the voltmeter 20. Both of them are transmitted through the cables 13 and 15 to the main body 16 of the measuring apparatus as induced voltages. Therefore, resistors 23 and 24 equal in resistance to the characteristic impedance of the cables 13 and 15 are connected in series respectively to the core wires of the cables 13 and 15 at the input side thereof to eliminate errors in transmission originating from the cables.

Figure 5:
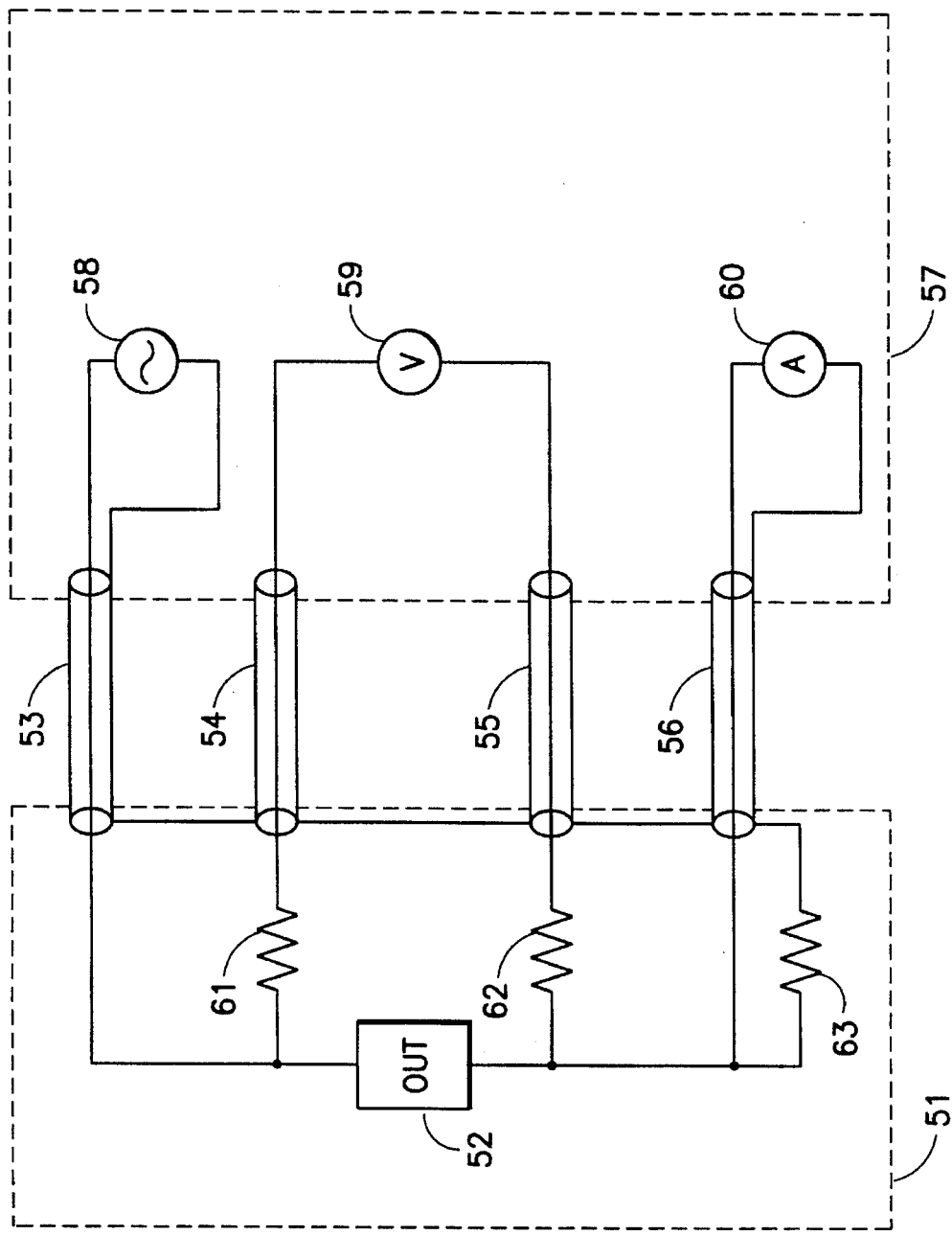
FIG. 5 is an embodiment of an impedance measuring apparatus according to the present invention.
Figure 7:
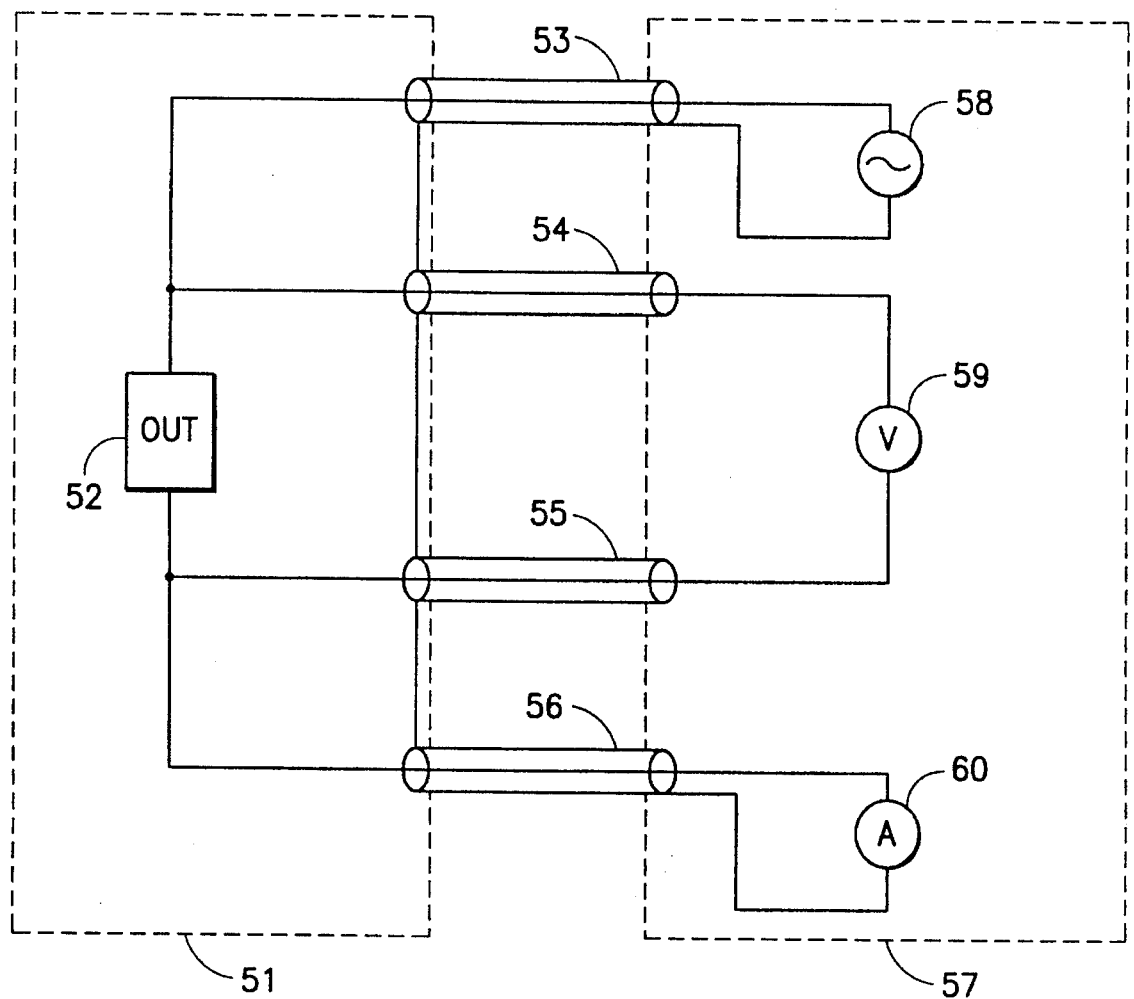
FIG. 7 shows the principles of measurement performed by a typical conventional impedance measuring apparatus.

FIG. 5 shows an embodiment of the present invention in impedance measurement. Elements having functions similar to those in FIG. 7 are given like reference numbers. Resistors 61 and 62 equal in resistance to the characteristic impedance of the cables 54 and 55 for measuring a voltage are connected in series respectively between the cables 54 and 55 and the device under test 52, and a resistor 63 having resistance equal to the characteristic impedance of the current measuring cable 56 is connected between the core wire and the outer conductor at the end of the device under test, allowing errors in transmission originating from the cables to be eliminated. This embodiment may be applied not only to impedance measurement but also to measurement of circuit constants such as inductance, capacitance and resistance as well as measurement of the characteristics of a dielectric.

Figure 6:
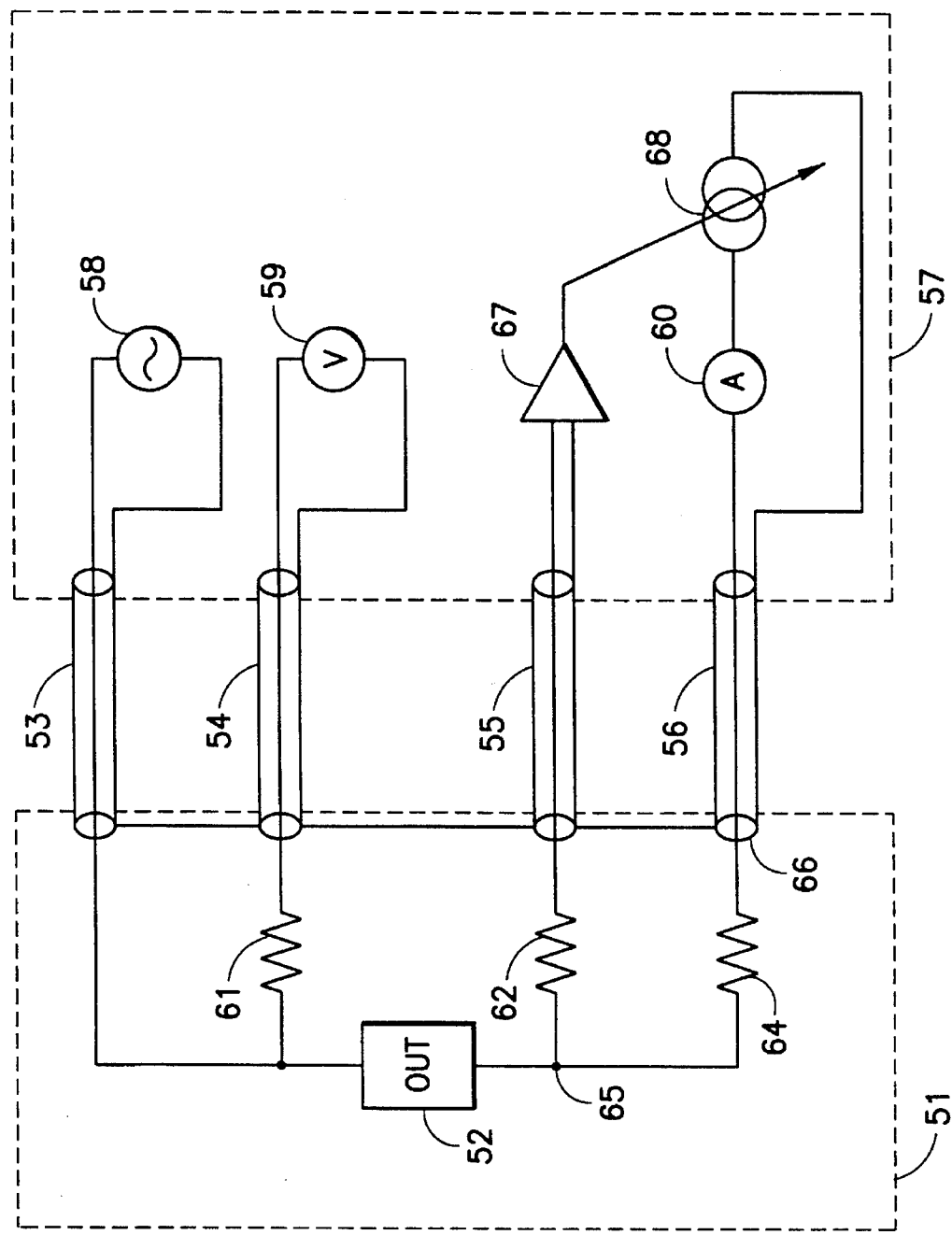
FIG. 6 is a second embodiment of an impedance measuring apparatus according to the present invention.

FIG. 6 shows an automatic balancing bridge as a second embodiment of the present invention in impedance measurement. A voltage at a terminal 65 of the device under test 52 is detected by an amplifier 67 to control a current source 68. The current source 68 is connected through the ammeter 60, the cable 56 to the terminal 66. A feedback circuit constituted by the amplifier 67, current source 68, ammeter 60 and cable 56 controls the current flowing through the device under test 52 to make the voltage at the terminal 65 0 V. The ammeter 60 measures the current flowing through the device under test 52. In order to prevent errors originating from the transmission characteristics of the cable 56 from being introduced in this measurement, a resistor 64 having resistance equal to the characteristic impedance of the cable 56 is connected in series to the core wire 66 of the cable. The reason for this is as follows. If the resistance of the resistor 64 is represented by r, since the Vx becomes 0 V, substitution of the Vx=0 and R=r in equation (4) will result in the following.

$$\begin{bmatrix} 0 \\ Ix \end{bmatrix} = \begin{bmatrix} 1 & r \\ 0 & 1 \end{bmatrix} \begin{bmatrix} \cos\beta L & jZ_0\sin\beta L \\ j\frac{1}{Z_0}\sin\beta L & \cos\beta L \end{bmatrix} \begin{bmatrix} Vm \\ Im \end{bmatrix} \quad (10)$$

If $r = Z_0$ and $Vm$ is eliminated from equation (10), $$\frac{Im}{Ix} = \exp(j2\pi L/\lambda) \quad (11)$$

The ratio of the amplitude of Im to that of Ix is as follows.

$$\left| \frac{Im}{Ix} \right| = 1 \quad (12)$$

Thus, the errors in amplitude originating from the cable can be eliminated. This embodiment may be applied not only to impedance measurement but also to measurement of circuit constants such as inductance, capacitance and resistance as well as measurement of the characteristics of a dielectric.

EFFECTS OF THE INVENTION

Implementation of the present invention allows measurement of a current and a voltage which is free from the influence of the transmission characteristics of cables. This measuring method makes it possible to accurately measure circuit constants and the characteristic values of a material even in measurement at high frequencies or in measurement wherein a long cable is used between the fixture and the main body of the measuring apparatus.

The present invention is not limited to the types and the like of the illustrated components, and modifications in configuration is possible as desired without departing from the principle of the present invention.

I claim:

1. A test apparatus for measuring a voltage or a current at a device under test (DUT), said test apparatus comprising:
    means for applying an excitation frequency signal to said DUT;
    transmission line means, having an input and an output, for connecting said DUT to measurement meter means so as to enable measurement of electrical characteristics of said DUT, said transmission line means exhibiting a characteristic impedance, said output directly connected to said measurement meter means without intervening impedance matching means to enable said measurement meter means to accurately measure signals at said output; and
    a resistor connecting said DUT to said input of said transmission line means, said resistor having a resistance equal to said characteristic impedance of said transmission line means, whereby measurement errors due to transmission characteristics of said transmission line means are prevented.

2. The test apparatus as recited in claim 1, wherein said transmission line means is a first coaxial cable and said resistor is connected to a core conductor of said first coaxial cable.

3. The test apparatus as recited in claim 2, wherein said test apparatus obtains magnetic characteristics of a magnetic material in said DUT by applying said excitation frequency signal to a primary coil wound around the magnetic material and by measuring an induced voltage generated across first and second terminals of a secondary coil wound around the magnetic material, wherein said resistor, which has a resistance equal to the characteristic impedance of said coaxial cable, is connected in series between a first said terminal of said secondary coil and said core conductor of said first coaxial cable, and further comprises:

a second coaxial cable having a core wire and outer conductor, connected to said measurement meter means; and a second resistance connected to a terminal of said primary coil and between said core wire and said outer conductor of said second coaxial cable, said second resistance having a resistance equal to the characteristic impedance of said second coaxial cable, whereby errors are eliminated that originate from transmission characteristics of said first and second coaxial cables.

4. The test apparatus as recited in claim 3, further comprising:

a third coaxial cable having a characteristic impedance and a core wire and outer conductor connected to said measurement meter means; and a third resistor connected in series between said second terminal of said secondary coil and said core conductor of said third coaxial cable, said third resistor having a resistance value equal to the characteristic impedance of said third coaxial cable.

* * * * *